United States Patent
Lee et al.

(10) Patent No.: US 7,453,962 B2
(45) Date of Patent: Nov. 18, 2008

(54) ADAPTIVE FREQUENCY CONTROL APPARATUS AND METHOD THEREOF

(75) Inventors: Seung-Hwan Lee, Daejeon (KR); Jin-Up Kim, Daejeon (KR)

(73) Assignee: Electronics And Telecommunicatons Research Institute, Daejeon (KR)

(*) Notice: Subject to any disclaimer, the term of this patent is extended or adjusted under 35 U.S.C. 154(b) by 647 days.

(21) Appl. No.: 10/856,155

(22) Filed: May 27, 2004

(65) Prior Publication Data
US 2005/0141655 A1 Jun. 30, 2005

(30) Foreign Application Priority Data
Dec. 27, 2003 (KR) ............. 10-2003-0098218

(51) Int. Cl.
*H04L 27/06* (2006.01)
(52) U.S. Cl. ............... 375/344; 375/322; 375/324; 455/192.1
(58) Field of Classification Search ......... 375/343, 375/344, 322; 455/192.1
See application file for complete search history.

(56) References Cited

U.S. PATENT DOCUMENTS

| | | | | |
|---|---|---|---|---|
| 4,228,434 A * | 10/1980 | Williamson et al. | ......... | 342/100 |
| 5,901,184 A * | 5/1999 | Ben-Efraim et al. | ........ | 375/344 |
| 6,058,147 A * | 5/2000 | Eklof et al. | ................ | 375/344 |
| 6,275,542 B1 * | 8/2001 | Katayama et al. | ........... | 375/322 |
| 6,341,123 B1 * | 1/2002 | Tsujishita et al. | ........... | 370/210 |
| 6,542,039 B1 * | 4/2003 | Ogura | ......................... | 331/11 |
| 6,750,725 B2 * | 6/2004 | Lee et al. | ..................... | 331/1 A |
| 2001/0055319 A1 * | 12/2001 | Quigley et al. | .............. | 370/480 |
| 2002/0173284 A1 * | 11/2002 | Forrester | .................... | 455/255 |
| 2003/0235258 A1 * | 12/2003 | Kenney et al. | .............. | 375/344 |
| 2004/0125872 A1 * | 7/2004 | Antoine et al. | .............. | 375/222 |

FOREIGN PATENT DOCUMENTS

| | | |
|---|---|---|
| KR | 10-1998-0051033 | 11/1998 |
| KR | 000033949 | 6/2000 |
| KR | 10-2000-0057289 | 9/2000 |
| KR | 1020000057289 | 9/2000 |
| KR | 10-2001-0016612 | 3/2001 |
| KR | 1020010016612 | 3/2001 |
| WO | WO-98/23071 | 5/1998 |

* cited by examiner

*Primary Examiner*—David C Payne
*Assistant Examiner*—Leon-Viet Q Nguyen
(74) *Attorney, Agent, or Firm*—Blakely, Sokoloff, Taylor & Zafman LLP

(57) ABSTRACT

The adaptive frequency control apparatus includes: a frequency downstreamer for converting the frequency of the radio frequency signal to a frequency of a defined band according to a reference signal; a frequency error measurer for measuring a frequency error between a frequency of the output signal of the frequency downstreamer and a defined frequency; a loop filter for filtering the frequency error output from the frequency error measurer based on a plurality of operational parameters, the operational parameters being changeable; a differential amplifier for generating a control signal for a voltage control based on the output signal of the loop filter; and a voltage-controlled oscillator for changing the frequency of the reference signal according to the control signal of the differential amplifier.

7 Claims, 4 Drawing Sheets

ADAPTIVE FREQUENCY CONTROL APPARATUS AND METHOD THEREOF

CROSS REFERENCE TO RELATED APPLICATION

This application claims priority to and the benefit of Korea Patent Application No. 2003-98218 filed on Dec. 27, 2003 in the Korean Intellectual Property Office, the content of which is incorporated herein by reference.

BACKGROUND OF THE INVENTION (a) Field of the Invention

The present invention relates to an adaptive frequency control apparatus and a method thereof. More specifically, the present invention relates to an adaptive frequency control apparatus and a method thereof that are necessary for the integration of radio frequency (RF) devices of different digital communication systems and a digital signal processor.

(b) Description of the Related Art

In digital communication, especially digital mobile communication systems, RF frequency control is an important factor that determines system performance. RF frequency control between a base station and a terminal of the digital mobile communication system is needed for the following two reasons.

One reason is that an error of reference frequency sources between the base station and the terminal must be compensated. The error of reference frequency sources can be easily corrected without affecting a deterioration of performance, because it is almost static when ignoring temperature deviations or aging.

The other is that the Doppler frequency deviation and other channel environments are changing due to the movement of the terminal. The frequency deviation from the Doppler effect is non-static, because it changes according to the specific central frequency and the moving speed of the terminal.

The change in the channel environment caused by the movement of the terminal affects the frequency control performance more, so there is a need for taking measures to cope with it. The related technology is disclosed in Korean Patent Application No. 1998-51033 (applied on Nov. 26, 1998) under the title of "Loop Filter Coefficient Dynamic Allocation Method". This conventional method includes determining a loop filter coefficient adequate to each situation and properly applying it to the change in the channel environment so as to prevent a deterioration of the frequency control performance possibly caused by the Doppler effect and a sudden change in the channel.

The RF frequency control is usually called "automatic frequency control (AFC)", because it is automatically performed with a modem algorithm, and there are two AFC methods as follows.

One method involves a directly calculation of a frequency error at a digital receiver to directly control an analog VCO (Voltage Controlled Oscillator), and the other includes a correction of the frequency error with a digital NCO (Numerically Controlled Oscillator) at the digital receiver.

These two methods have good and bad points of their own. In the mobile communication system, there are some cases where the terminal must be synchronized in both frequency and time with the base station. For this purpose, a control of the analog VCO is necessarily performed.

Recently, many methods for processing the frequency error at a digital signal processor have been suggested so as to minimize the interface between the RF processor and the digital signal processor. For example, Korean Patent Application No. 2001-16612 (applied on Mar. 29, 2001) discloses an automatic frequency tracking apparatus and a method thereof. But, correcting the frequency error at the digital receiver is problematic in that the frequency control range is confined according to the symbol rate. With a general algorithm, the digital receiver can correct a frequency error of up to about 10% of the symbol rate. To correct a frequency error of above 10% of the symbol rate, the frequency control range must be confined through RF frequency sweeping.

The conventional methods proposed for the frequency control have limitations as follows.

First, the structure supporting different RF systems is not considered. When RF systems A and B are used to control an RF VCO, and an RF system C is used to correct the frequency error at a digital receiver, for example, there are some probable problems as follows.

(1) When the VCO control range is 1 V for RF system A and 0.5 V for RF system B so as to have a same RF output frequency error at the antenna output, the control resolution of the RF system A is half the control resolution of the RF system B with the same control loop and algorithm of the RF system B, thus resulting in a deterioration of performance.

(2) When the frequency error required in the system standard of RF system A is less than that in the system standard of RF system B, the RF system A needs a more precise frequency control than the RF system B.

(3) For RF system C, which is used to correct the frequency error at the digital end, frequency sweeping of RF is needed when the frequency correction range is smaller than the frequency error range.

Beside the aforementioned problems, all the control circuits related to AFC must have a structure that can be easily reconfigured in software, so as to match different RF systems to a digital communication system. But this is impossible with the AFC structure designed for a specific system in the conventional methods.

Second, the conventional methods do not consider a real-time debugging for an RF controller that is necessary for the matching of the RF processor and the digital signal processor. In addition, there is a need for a structure of monitoring AFC-related circuits in real time to reduce the development period and to acquire optimal AFC parameters. However, the conventional methods cannot provide such a structure, because they have AFC circuits as a black box type that shows an input-output system alone.

SUMMARY OF THE INVENTION

It is therefore an advantage of the present invention to provide an adaptive frequency control apparatus and a method thereof that can be easily applied to the systems of different standards and facilitate the optimization of parameters.

It is another advantage of the present invention to provide an adaptive frequency control apparatus and a method thereof that allows a real-time verification of changes in parameters and performance.

In one aspect of the present invention, there is provided an adaptive frequency control apparatus that includes: a frequency downstreamer for converting the frequency of the radio frequency signal to a frequency of a defined band according to a reference signal; a frequency error measurer for measuring a frequency error between a frequency of the output signal of the frequency downstreamer and a defined frequency; a loop filter for filtering the frequency error output from the frequency error measurer based on a plurality of operational parameters, the operational parameters being changeable; a differential amplifier for generating a control signal for a voltage control based on the output signal of the loop filter; and a voltage-controlled oscillator for changing the frequency of the reference signal according to the control signal of the differential amplifier.

In another aspect of the present invention, there is provided an adaptive frequency control apparatus that includes: a frequency downstreamer for converting the frequency of the radio frequency signal to a frequency of a predetermined band according to an input reference signal; a frequency error measurer for measuring a frequency error between a frequency of the output signal of the frequency downstreamer and a predetermined frequency; a loop filter for filtering the frequency error output from the frequency error measurer based on a plurality of operational parameters, the operational parameters being changeable; a numerically controlled oscillator for controlling a numeral of the output signal based on the output of the loop filter; a frequency error compensator for compensating for the frequency of the output signal of the frequency downstreamer according to the output signal of the numerically controlled oscillator, and transmitting the compensated frequency to the frequency error measurer; a frequency sweeping processor for determining whether to perform frequency sweeping and determining a sweeping range based on the output signal of the frequency error measurer, and outputting a corresponding control signal; a differential amplifier for converting the control signal to a sweeping control signal; and a voltage-controlled oscillator for changing a frequency of the reference signal according to the sweeping control signal of the differential amplifier.

In the adaptive frequency control apparatus, the loop filter is constructed with a software program. The adaptive frequency control apparatus can further include a central processor unit for providing a software program for the loop filter. The central processor unit downloads the software program to the loop filter.

The adaptive frequency control apparatus further includes: an analog/digital converter for converting the output signal of the frequency downstreamer to a digital signal; and a digital/analog converter for converting a signal to be fed into the differential amplifier to an analog signal, and outputting the analog signal to the differential amplifier.

The differential amplifier includes: an amplifier for comparing an input signal at a first input with a reference voltage at a second input, and amplifying the difference to generate a control signal; and a variable bias resistor formed between the first input and the output of the amplifier to adjust the output value of the control signal.

In further another aspect of the present invention, there is provided an adaptive frequency control method that includes: (a) estimating a frequency error of the radio frequency signal; (b) transmitting the estimated frequency error to a loop filter having operational parameters that are changeable, for filtering the signal; (c) converting the filtered signal to a control voltage value corresponding to a required control range; and (d) changing the frequency of the radio frequency signal based on the control voltage value to compensate for the frequency error.

The adaptive frequency control method further includes: (e) determining whether to perform frequency sweeping and determining a sweeping range based on the estimated frequency error; (f) generating a control voltage value according to the determined sweeping range, when it is determined to perform frequency sweeping; and (g) sweeping the frequency of the radio frequency signal according to the control voltage value.

The present invention facilitates matching and parameter optimization of an RF frequency controller necessary for system integration and allows the loop filter and the frequency control range to be changeable in software, so it can be easily applied to systems of different standards. The present invention also enables real-time verification of the changes in parameters and performance to reduce the development period and to guarantee an optimal RF frequency control performance.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
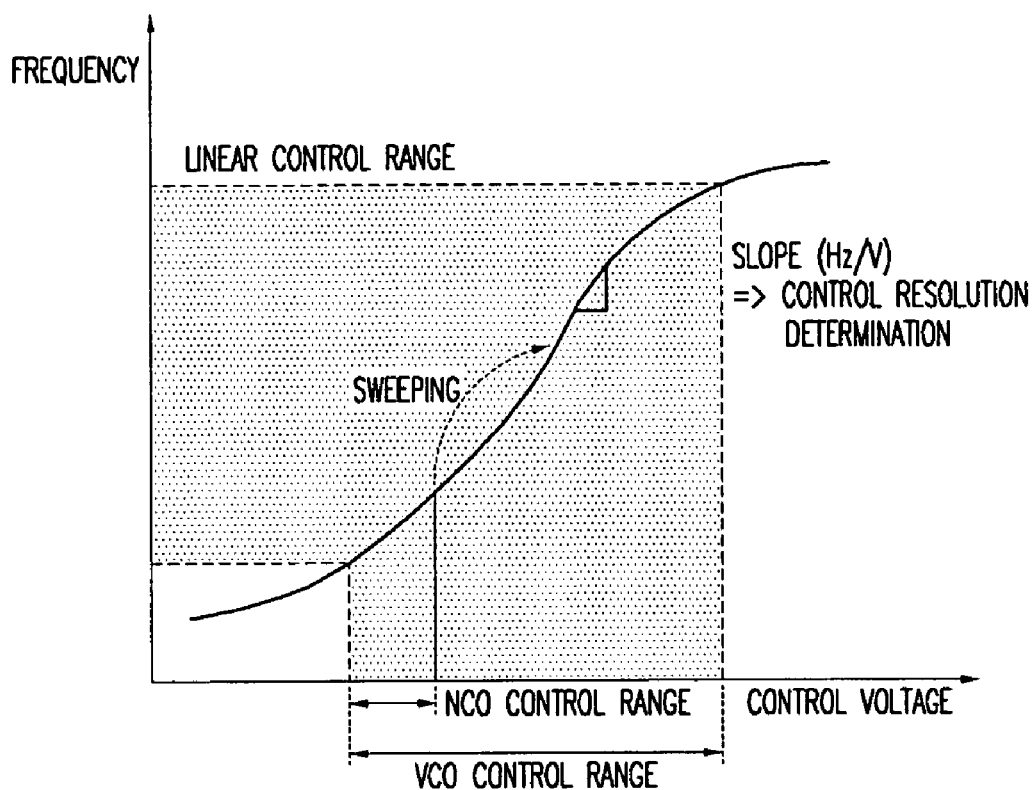
FIG. 1 is a diagram for explaining the necessity and principle of an adaptive frequency control apparatus according to the present invention.

FIG. 1 is a diagram for explaining the necessity and principle of an adaptive frequency control apparatus according to the present invention.

The voltage-controlled oscillator generally used for RF frequency control has the voltage/frequency characteristic shown in FIG. 1. For the frequency control, a linear range is actually used such that the frequency value varies linearly with respect to an input voltage value. With a large slope of the linear curve, small changes in the control voltage induce significant fluctuations in the frequency, so more precise resolution of the frequency control voltage is needed than with a smaller slope of the curve.

All the RF systems do not have a same linear range, since the linear range is dependent upon the standard of each voltage control regulator. The RF frequency control range is also dependent upon the requirements of the system.

When the frequency change range is greater than the frequency error that is available in digital signal compensation, all the frequency change range must be covered with frequency sweeping at an analog end, apart from digital error compensation. The frequency control voltage is generally represented by a digital value, so there is a resolution according to the number of digital bits. With the same 16 bits used, for example, the fluctuating frequency width per bit gets greater as the frequency control range becomes wider, as a result of which the frequency control resolution is reduced. It is therefore necessary in designing the frequency controller circuit to confine a required frequency change range so as to utilize all the bit resolutions and hence to regulate the voltage range controlling the frequency.

For this purpose, the present invention includes a loop filter for RF frequency control capable of reconfiguration in software, a digital/analog converter for converting the measured digital RF frequency error to an analog value, a differential amplifier for changing the control range of a voltage-controlled oscillator (VOC) for RF frequency control, and a numerically controlled oscillator (NCO) enabling digital frequency control.

Figure 2:
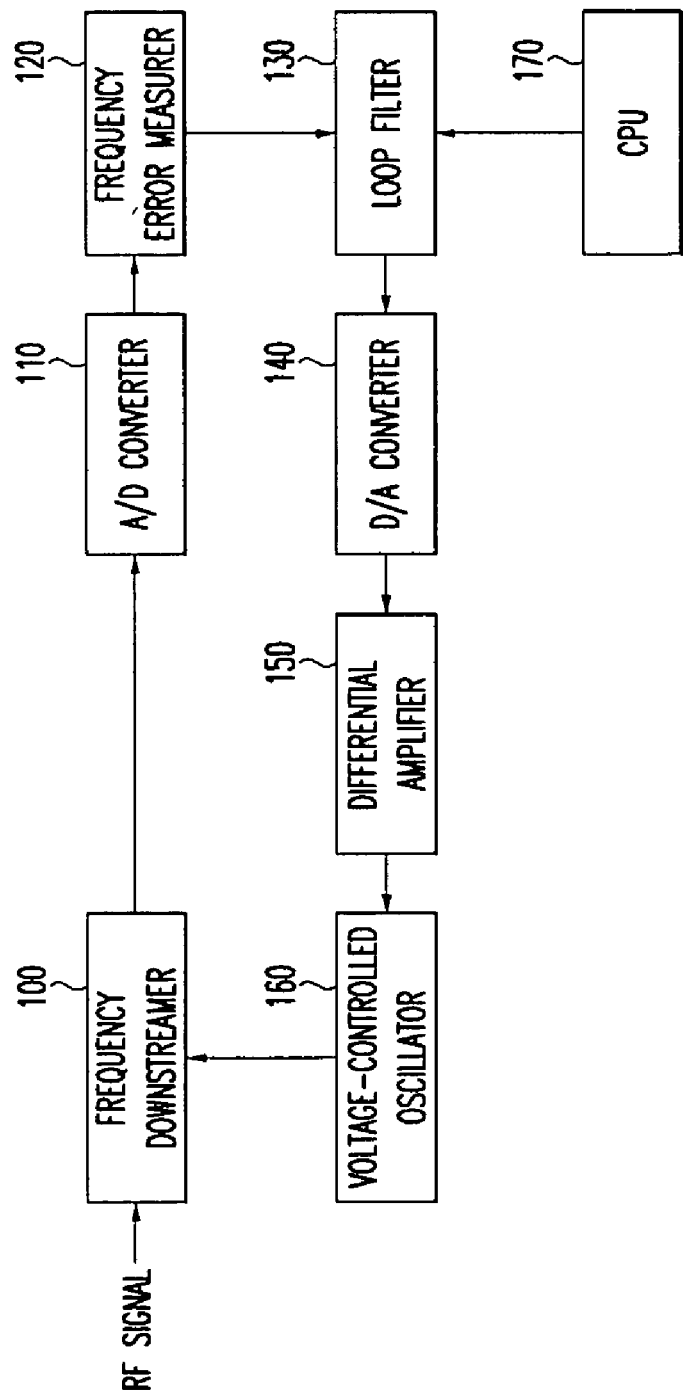
FIG. 2 is a schematic of an adaptive frequency control apparatus according to an embodiment of the present invention.

FIG. 2 is a schematic of an adaptive frequency control apparatus according to an embodiment of the present invention.

The adaptive frequency control apparatus according to the embodiment of the present invention comprises, as shown in FIG. 2, a frequency downstreamer 100, an analog/digital converter 110, a frequency error measurer 120, a loop filter 130, a digital/analog converter 140, a differential amplifier 150, a voltage-controller oscillator 160, and a CPU 170.

The frequency error measurer 120 measures a frequency error from a received signal (e.g., the output signal of the digital receiver) transferred from the frequency downstreamer 100 and the analog/digital converter 110. This frequency error measurement method depends upon the standard or structure of various systems employing the present invention, and can be any known measurement method in the related art. For a code division multiple access (CDMA) system, for example, pilot channels are used to calculate the current frequency error. The pilot channels, which are a reference signal having a constant phase without a data signal component, are subjected to de-spreading at the receiver end, and then the changes of their phase are monitored to measure the frequency error.

Subsequently, the measured frequency error is fed into the loop filter 130. The loop filter 130 smoothes the ripple component of the output signal (i.e., the frequency error signal) of the frequency error measurer 120, and outputs it to the voltage-controller oscillator 160. The loop filter 130 according to the embodiment of the present invention can be reconfigured, so its non-static characteristics, i.e., operational parameters such as loop filter type, loop bandwidth, loop gain, etc. are variable in software according to the system standard and the channel environment. The program for optimization of the type and parameters of the loop filter can be downloaded from the CPU 170. The reconfigurable loop filter 130 may be embodied with a digital signal processor (DSP) or a field programmable gate array (FPGA).

For example, the frequency automatic tracking control apparatus and the method thereof as disclosed in Korean Patent Application No. 2001-16612 use a simple integrator as a loop filter. According to the present invention, however, a proportional integral (PI) controller comprised of an integrator and a proportioner in software can be used when the integrator alone does not give the loop filter performance.

The frequency error signal from the loop filter 130 is converted to an analog signal through the digital/analog converter 140, and is used as an input value to control the analog voltage-controlled oscillator 160.

Figure 3:
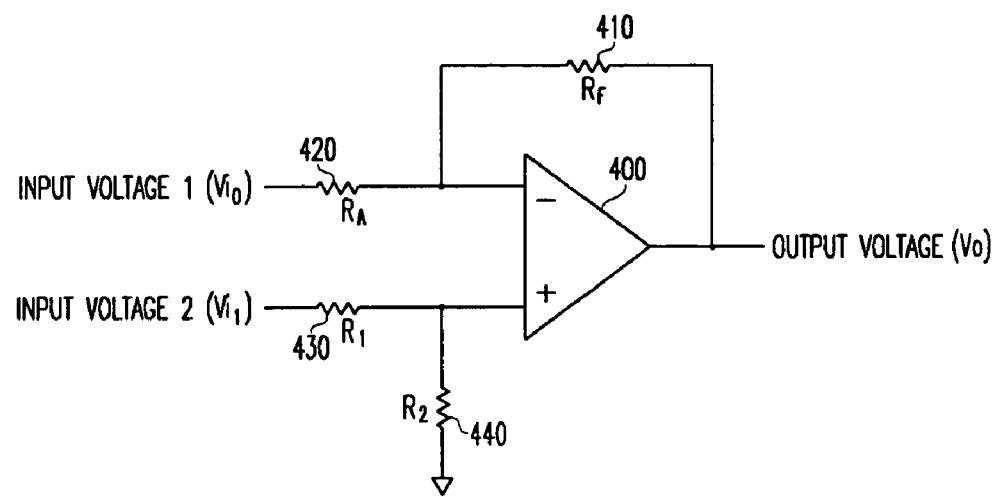
FIG. 3 is an exemplary diagram showing a differential amplifier having a variable control range in the adaptive frequency control apparatus according to the embodiment of the present invention.

The signal from the digital/analog converter 140 is fed into the differential amplifier 150 so as to adjust the frequency control range as shown in FIG. 1. The structure of the differential amplifier 150 is specifically illustrated in FIG. 3. FIG. 3 is an exemplary diagram of the differential amplifier having a variable control range in the adaptive frequency control apparatus according to the embodiment of the present invention.

In the differential amplifier 150 shown in FIG. 3, the output voltage fed into the voltage-controller oscillator 160 can be controlled with bias resistors 410, 420, 430, and 440 of the differential amplifier 150. The resistances of these resistors are variably controllable with a modem (not shown) of the digital receiver to find a desired frequency control range. But, the resistance control method is not specifically limited to this method. The following Equation 1 represents the output voltage of the differential amplifier circuit and shows that the output voltage is a function of input voltages and the respective resistances.

$$v_0 = \left[1 + \frac{R_F}{R_A}\right]\frac{R_2}{R_1 + R_2}v_{i0} - \frac{R_F}{R_A}v_{i1} \qquad \text{Equation 1}$$

According to Equation 1, the upper and lower limits of the output voltage can be determined with the two factors, i.e., bias resistances $R_1, R_2, R_A$, and $R_F$, and input voltages $V_{i0}$ and $V_{i1}$.

The adjusted signal from the differential amplifier 150 is fed into the voltage-controlled oscillator 160, which then changes the frequency of the output signal according to the input signal and outputs the frequency-controlled signal to the frequency downstreamer 100. The frequency downstreamer 100 corrects the frequency error of the received signal based on the reference signal (i.e., the output signal of the voltage-controller oscillator) adjusted according to the frequency error component of the received signal, as previously described.

On the other hand, the adaptive frequency control apparatus according to the embodiment of the present invention can also be embodied into another structure.

Figure 4:
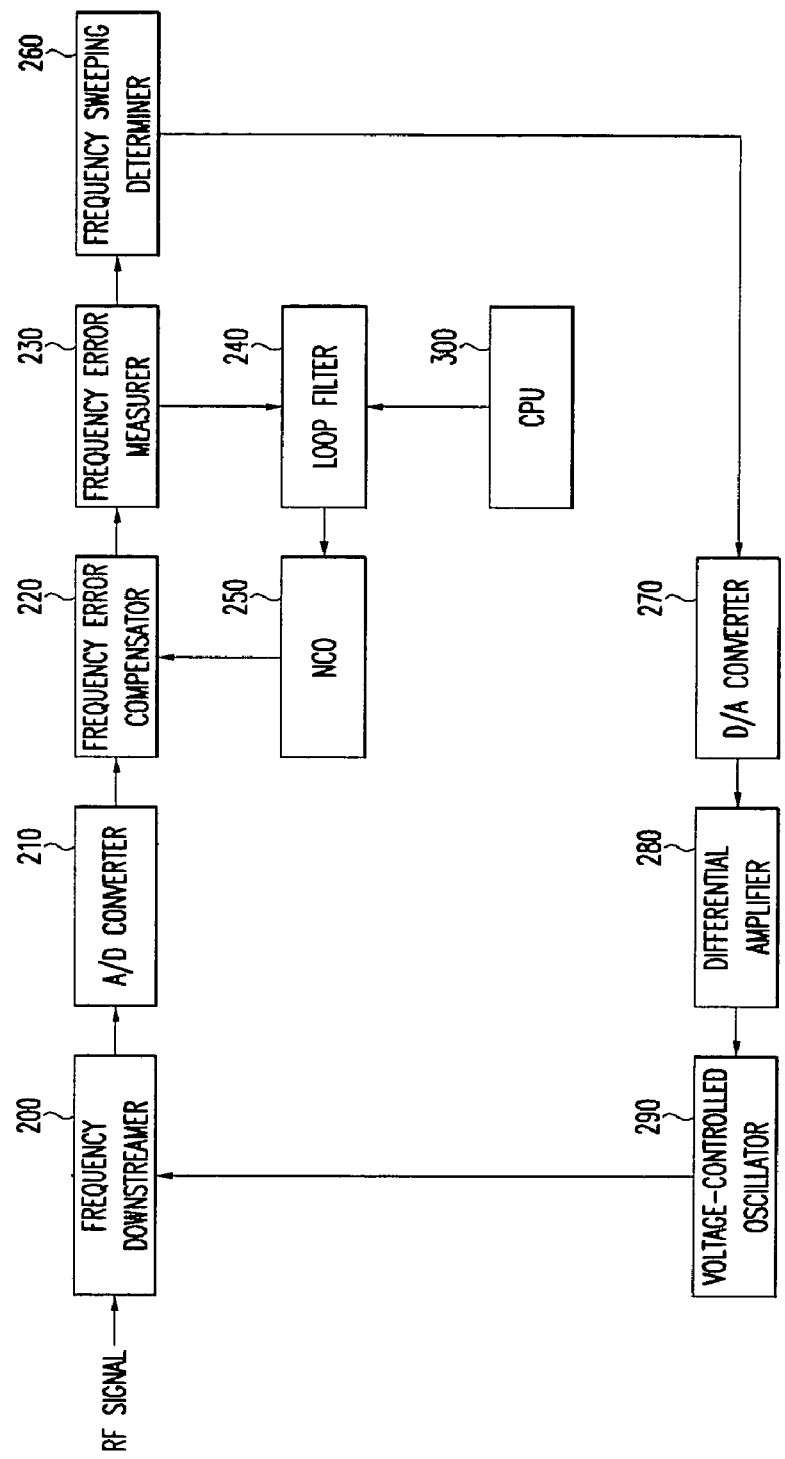
FIG. 4 is a schematic of an adaptive frequency control apparatus according to another embodiment of the present invention.

FIG. 4 is a schematic of an adaptive frequency control apparatus according to a second embodiment of the present invention.

The adaptive frequency control apparatus according to the second embodiment of the present invention comprises, as shown in FIG. 4, a frequency downstreamer 200, an analog/digital converter 210, a frequency error compensator 220, a frequency error measurer 230, a loop filter 240, a numerically controlled oscillator 250, a frequency sweeping determiner 260, a digital/analog converter 270, a differential amplifier 280, a voltage-controller oscillator 290, and a CPU 300.

The adaptive frequency control apparatus according to the second embodiment of the present invention has almost the same configuration as the embodiment shown in FIG. 2, excepting that the digital receiver compensates for the frequency error through the numerically controlled oscillator 250 for frequency control and controls the voltage-controlled oscillator 290 using the frequency sweeping determiner 260 for frequency sweeping.

The frequency error measurer 220 measures the frequency error of the received signal from the frequency downstreamer 200 and the analog/digital converter 110, and the loop filter 240 filters the frequency error. The frequency error is fed into the voltage-controlled oscillator 290, which then compensates for the frequency error.

Regarding the frequency synchronization, there are two parameters, frequency acquisition range and frequency tracking range. The frequency tracking range, which is generally smaller than the frequency acquisition range, is defined as a range in which the actually fluctuating frequency error can be measured and eliminated. When the frequency error is compensated with the pilot channel but hardly reduced, i.e., when the phase of the de-spread pilot channel is continuously fluctuating, the current frequency measurement range is out of the frequency tracking range and the frequency sweeping determiner 260 adjusts the frequency tracking range. The algorithm determining the frequency sweeping is dependent on the type of the communication system. Here, the frequency acquisition range represents the total frequency error control range that can be controlled by frequency sweeping, and the frequency tracking range represents the frequency error range that can be controlled with the voltage-controlled oscillator NCO through frequency measurements.

With a continuous failure of digital frequency compensation, the frequency sweeping determiner 260 determines that the frequency control range is inadequate, and adjusts the control range. During this operation, the differential amplifier 280 determines a defined frequency value of the voltage-controlled oscillator 290.

Unlike the aforementioned embodiment of FIG. 2, the voltage-controlled oscillator 290 outputs a constant frequency value until the frequency sweeping determiner 260 changes the frequency value. The specific operation is the same as described in the embodiment of FIG. 2 and will not be further described in detail.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

As described above, the present invention guarantees an efficient RF frequency control that is necessary for integration of RF devices of different digital communication systems and a digital signal processor.

The present invention facilitates the matching and the parameter optimization of an RF frequency controller necessary for system integration and allows the loop filter and the frequency control range to be changeable in software, so it can be easily applied to the systems of different standards.

Furthermore, the present invention enables real-time verification of the changes in parameters and performance to reduce the development period and to guarantee optimal RF frequency control performance.

What is claimed is:

1. An adaptive frequency control apparatus, which is in a device for controlling the frequency of a received radio frequency signal in a digital communication system, the adaptive frequency control apparatus comprising:
   a frequency downstreamer for converting the frequency of the radio frequency signal to a frequency of a predetermined band according to an input reference signal;
   a frequency error measurer for measuring a frequency error between a frequency of the output signal of the frequency downstreamer and a predetermined frequency;
   a loop filter for filtering the frequency error output from the frequency error measurer based on a plurality of operational parameters, the operational parameters being changeable;
   a numerically controlled oscillator for controlling a numeral of the output signal based on the output of the loop filter;
   a frequency error compensator for compensating for the frequency of the output signal of the frequency downstreamer according to the output signal of the numerically controlled oscillator, and transmitting the compensated frequency to the frequency error measurer;
   a frequency sweeping processor for determining whether to perform frequency sweeping and determining a sweeping range based on the output signal of the frequency error measurer, and outputting a corresponding control signal;
   a differential amplifier for converting the control signal to a sweeping control signal; and
   a voltage-controlled oscillator for changing a frequency of the reference signal according to the sweeping control signal of the differential amplifier,
   wherein one of the plurality of operational parameters is variable in software according to different system standards, and
   wherein a frequency error range controlled by the numerically controlled oscillator is smaller than a frequency error control range controlled by the voltage controlled oscillator.

2. The adaptive frequency control apparatus as in claim 1, wherein the loop filter is constructed with a software program.

3. The adaptive frequency control apparatus as in claim 2, further comprising:
   a central processor unit for providing a software program for the loop filter,
   the central processor unit for downloading the software program to the loop filter.

4. The adaptive frequency control apparatus as in claim 1, further comprising:
   an analog/digital converter for converting the output signal of the frequency downstreamer to a digital signal; and
   a digital/analog converter for converting a signal to be fed into the differential amplifier to an analog signal, and outputting the analog signal to the differential amplifier.

5. The adaptive frequency control apparatus as in claim 1, wherein the differential amplifier comprises:
   an amplifier for comparing an input signal at a first input terminal with a reference voltage at a second input terminal, and amplifying the difference to generate a control signal; and
   a variable bias resistor formed between the first input and the output of the amplifier to control the output value of the control signal.

6. An adaptive frequency control method, which is for controlling the frequency of a received radio frequency signal in a digital communication system, the adaptive frequency control method comprising:
   (a) estimating a frequency error of the radio frequency signal;
   (b) transmitting the estimated frequency error to a loop filter having a plurality of operational parameters that are changeable, for filtering the signal;
   (c) converting the filtered signal to a control voltage value corresponding to a required control range;
   (d) changing the frequency of the radio frequency signal based on the control voltage value to compensate for the frequency error;
   (e) determining whether to perform frequency sweeping and determining a sweeping range based on the estimated frequency error;
   (f) generating a control voltage value according to the determined sweeping range, when it is determined to perform frequency sweeping; and
   (g) sweeping the frequency of the radio frequency signal according to the control voltage value wherein one of the plurality of operational parameters is variable in software according to different system standards, and wherein an error range of the changed radio frequency to compensate for the frequency error is smaller than an error control range of the determined frequency sweeping range.

7. The adaptive frequency control method as in claim 6, wherein the loop filter can be reconstructed by changing the operational parameters, the operational parameters being changed by a software program, the software program being downloaded from an external device.

* * * * *